US010323655B2

(12) United States Patent
Arima et al.

(10) Patent No.: US 10,323,655 B2
(45) Date of Patent: Jun. 18, 2019

(54) FAN MOTOR

(71) Applicant: Nidec Corporation, Kyoto (JP)

(72) Inventors: Kumiko Arima, Kyoto (JP);
Shigekatsu Matsuda, Kyoto (JP);
Takamasa Yamashita, Kyoto (JP);
Yuuichi Sakuma, Kyoto (JP); Ryota Yamagata, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 225 days.

(21) Appl. No.: 15/422,555

(22) Filed: Feb. 2, 2017

(65) Prior Publication Data
US 2017/0227020 A1    Aug. 10, 2017

(30) Foreign Application Priority Data

Feb. 8, 2016   (JP) ................................ 2016-021459

(51) Int. Cl.
*F04D 29/66*   (2006.01)
*F04D 29/52*   (2006.01)
(Continued)

(52) U.S. Cl.
CPC ......... *F04D 29/665* (2013.01); *F04D 19/002* (2013.01); *F04D 25/06* (2013.01);
(Continued)

(58) Field of Classification Search
CPC ........... F05B 2260/96; F05B 2260/962; F05B 2260/964; F04D 29/664; F04D 29/665;
(Continued)

(56) References Cited

U.S. PATENT DOCUMENTS 2,252,256 A    8/1941  Harris
5,215,433 A  * 6/1993  Weiland ................ F04D 29/526
                                                415/119
(Continued)

FOREIGN PATENT DOCUMENTS

EP    1 980 755 A2   10/2008
FR    2414649 A1 *   8/1979  ............ F04D 29/54
(Continued)

OTHER PUBLICATIONS

Siyuan, L. "Training Textbook for Valuation with Bill Quantity of Construction Electric Works;" China Building Materials Press; First Edition, Jan. 2014; 3 pages.

*Primary Examiner* — David E Sosnowski
*Assistant Examiner* — Maranatha Boardman
(74) *Attorney, Agent, or Firm* — Keating & Bennett, LLP

(57) ABSTRACT

A fan motor includes a motor, an impeller and a housing. The housing includes an inner wall portion, a silencer portion, and a communicating opening. The inner wall portion extends along a rotation axis to assume a tubular shape, and houses at least a portion of the impeller therein. The silencer portion includes a portion radially outside of the inner wall portion, and defines a silencing space between the inner wall portion and the silencer portion. The communicating opening brings a space inside of the inner wall portion into communication with the silencing space. A portion of the communicating opening is defined by an end portion of the inner wall portion on an inlet side. The silencing space covers only a portion of the circumferential extent of the inner wall portion. This allows the silencing space to be arranged in a dead space around the inner wall portion.

12 Claims, 21 Drawing Sheets

(51) Int. Cl.
*F04D 19/00* (2006.01)
*F04D 29/32* (2006.01)
*F04D 25/06* (2006.01)
*H05K 7/20* (2006.01)

(52) U.S. Cl.
CPC ....... *F04D 25/0613* (2013.01); *F04D 29/325* (2013.01); *F04D 29/522* (2013.01); *H05K 7/20745* (2013.01)

(58) Field of Classification Search
CPC .... F04D 29/522; F04D 29/526; F04D 19/002; F04D 25/002; F04D 25/0613; H05K 7/20745; H05K 7/20136; H05K 7/20563–20572
USPC ....................................................... 415/119
See application file for complete search history.

(56) References Cited

U.S. PATENT DOCUMENTS

| | | | |
|---|---|---|---|
| 5,551,841 A | 9/1996 | Kamada | |
| 6,572,333 B2* | 6/2003 | Fujinaka | F04D 29/547 415/208.2 |
| 7,658,592 B1* | 2/2010 | Jarrah | F04D 29/526 415/119 |
| 7,891,464 B2* | 2/2011 | Tang | F04D 25/08 181/224 |
| 2003/0183446 A1 | 10/2003 | Shah et al. | |

FOREIGN PATENT DOCUMENTS

| | | |
|---|---|---|
| JP | 2002-171716 A | 6/2002 |
| JP | 2006-189000 A | 7/2006 |
| JP | 2007-218150 A | 8/2007 |
| JP | 2013-167189 A | 8/2013 |

* cited by examiner

FAN MOTOR

CROSS REFERENCE TO RELATED APPLICATIONS

This application claims the benefit of priority to Japanese Patent Application No. 2016-021459 filed on Feb. 8, 2016. The entire contents of this application are hereby incorporated herein by reference.

BACKGROUND OF THE INVENTION

1. Field of the Invention

The present invention relates to a fan motor.

2. Description of the Related Art

Axial fan motors arranged to produce axial air flows by rotating impellers using driving forces of motors have been known. The axial fan motors are, for example, installed in household electrical appliances, office automation appliances, transportation equipment, and so on, and are used for the purposes of cooling electronic components, circulating gases in device cases, and so on. In addition, such fan motors are sometimes used for circulating gases in server rooms in which a large number of electronic devices are installed. A known fan motor is described in, for example, JP-A 2007-218150.

The fan motor described in JP-A 2007-218150 includes a casing defining a wind channel inside thereof, and a rotor fan and a stator housed in the casing. Once this fan motor is driven, a plurality of blades of the rotor fan are caused to rotate to produce an axial air flow in the wind channel.

In recent years, there has been an increasing demand for an increase in efficiency of fan motors. However, if the flow rate of a fan motor is increased in order to improve the efficiency of the fan motor, noise inevitably increases. Accordingly, in recent years, there has been an increasing need for reducing noise of the fan motors. Meanwhile, in recent years, there has been an increasing demand for reducing the size of the fan motors. Therefore, it is not desirable to increase the size of a fan motor in order to achieve reduced noise. Accordingly, there has been a demand for a technique for reducing noise of a fan motor without increasing the size of a space in which the fan motor is installed.

A space in which the known fan motor described in JP-A 2007-218150 is installed is a space which includes flanges and is substantially square when viewed in an axial direction. In this case, spaces extending in the axial direction between the two flanges are dead spaces. That is, this fan motor has dead spaces covering only a part of the circumferential extent thereof. If a reduction in the noise of the fan motor can be achieved by utilizing such dead spaces, the reduction in the noise of the fan motor can be achieved without an increase in the size of the space in which the fan motor is installed.

SUMMARY OF THE INVENTION

A fan motor according to a preferred embodiment of the present invention includes a motor including a stationary portion and a rotating portion arranged to rotate about a rotation axis; an impeller including a plurality of blades, and arranged to rotate together with the rotating portion; and a housing arranged to house the motor and the impeller therein. The housing includes a tubular inner wall portion arranged to extend from an inlet side to an outlet side along the rotation axis, and arranged to house at least a portion of the impeller therein; a silencer portion including a portion arranged radially outside of the inner wall portion, and arranged to define a silencing space between the inner wall portion and the silencer portion; and a communicating opening arranged to bring a space inside of the inner wall portion into communication with the silencing space. A portion of the communicating opening is defined by an end portion of the inner wall portion on the inlet side. The silencing space is arranged to cover only a portion of a circumferential extent of the inner wall portion.

The fan motor according to the above preferred embodiment of the present invention allows the silencing space to be arranged in a dead space around the inner wall portion. Accordingly, a reduction in noise can be achieved without an increase in the size of a space in which the fan motor is installed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the accompanying drawings. It is assumed herein that a direction parallel to a rotation axis of a fan motor is referred to by the term "axial direction", "axial", or "axially", that directions perpendicular to the rotation axis of the fan motor are each referred to by the term "radial direction", "radial", or "radially", and that a direction along a circular arc centered on the rotation axis of the fan motor is referred to by the term "circumferential direction", "circumferential", or "circumferentially".

Figure 2:
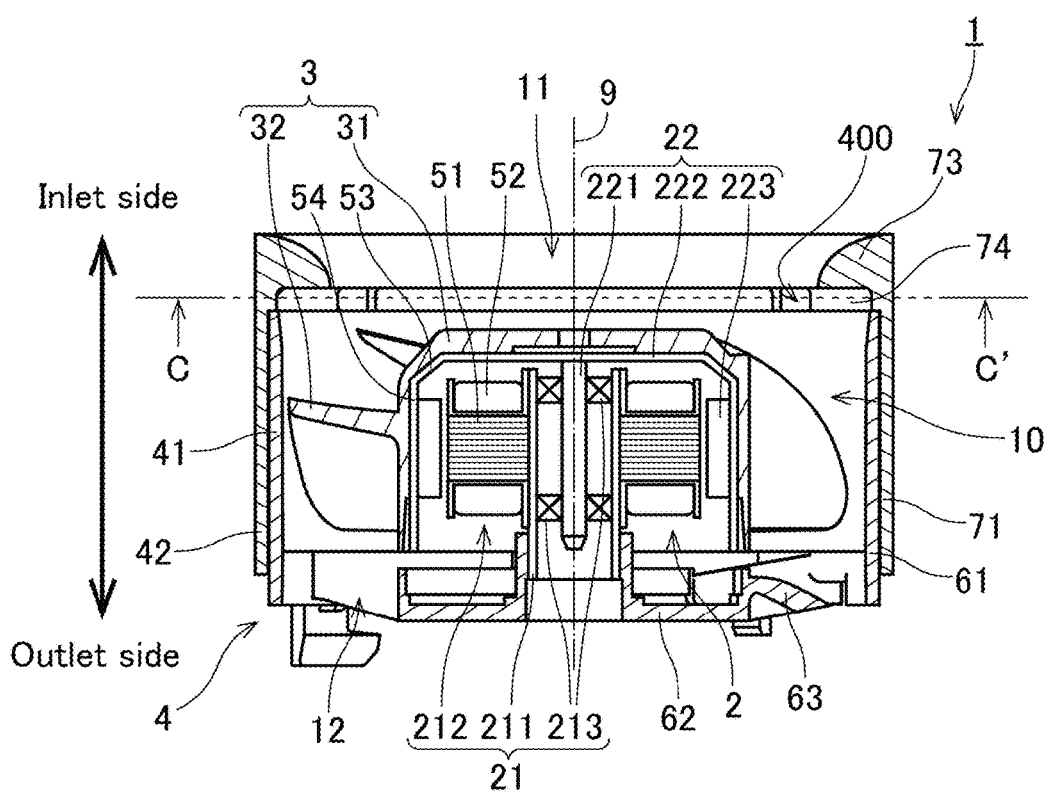
FIG. 2 is a sectional view of the fan motor according to the first preferred embodiment of the present invention.
Figure 3:
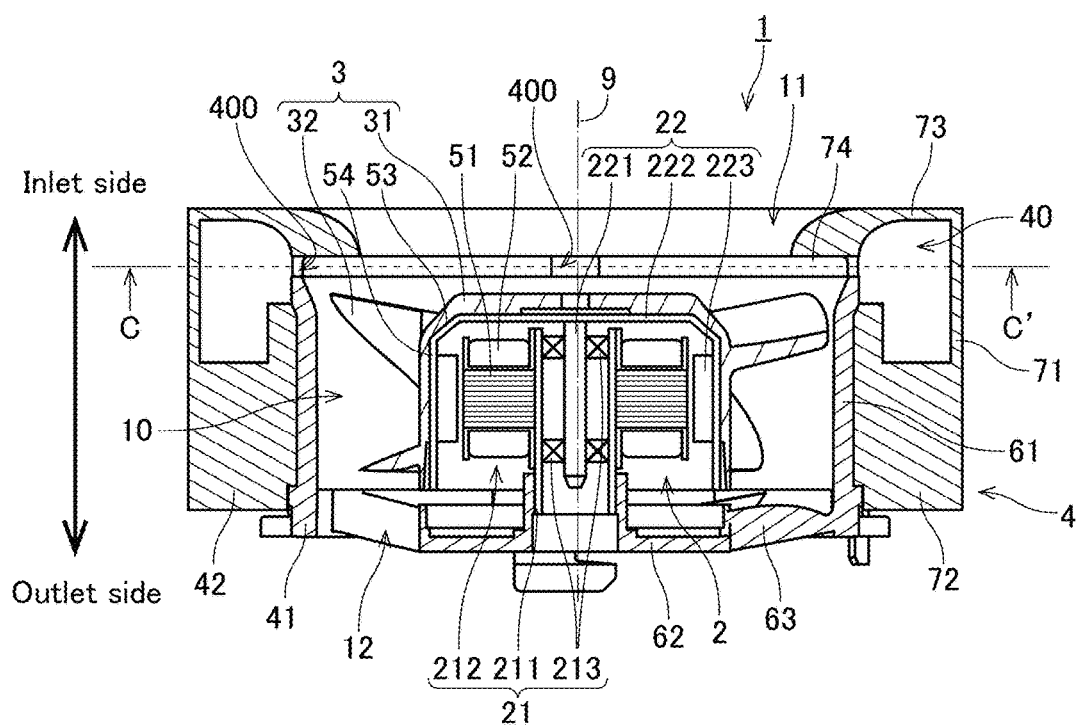
FIG. 3 is a sectional view of the fan motor according to the first preferred embodiment of the present invention.

It is also assumed herein that, with respect to an axial direction, an upper side in FIGS. 2 and 3, from which air is taken in, will be referred to as an "inlet side" or simply as an "upper side", and a lower side in FIGS. 2 and 3, toward which the air is discharged, will be referred to as an "outlet side" or simply as a "lower side". Note that the above definitions of the "upper side" and the "lower side" are made simply for the sake of convenience in description, and have no relation to the direction of gravity. Fan motors according to preferred embodiments of the present invention may be used in any orientation.

Figure 1:
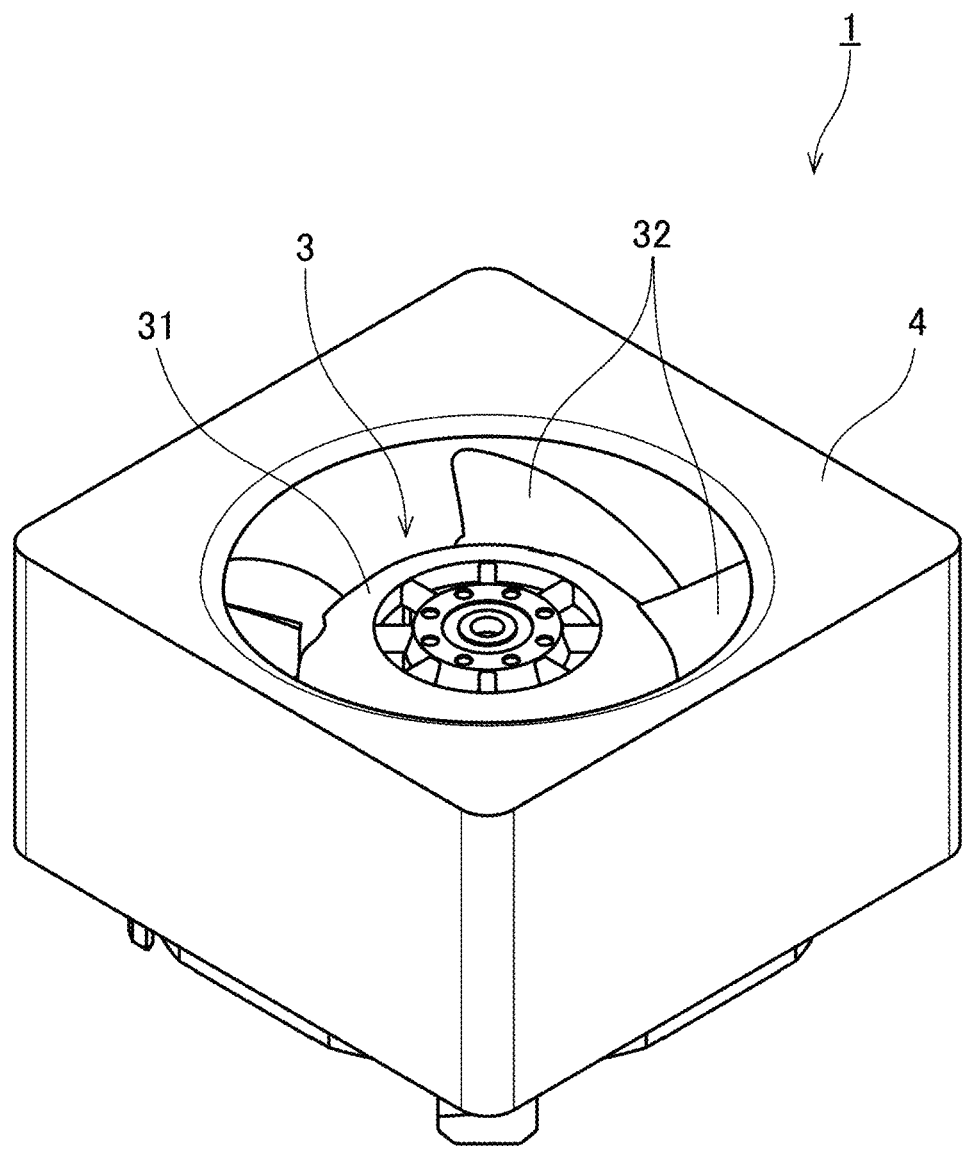
FIG. 1 is a perspective view of a fan motor according to a first preferred embodiment of the present invention.

FIG. 1 is a perspective view of a fan motor 1 according to a first preferred embodiment of the present invention. FIG. 2 is a vertical sectional view of the fan motor 1 taken along a plane that does not pass through any silencing space 40 (i.e., along line A-A' in FIG. 4). FIG. 3 is a vertical sectional view of the fan motor 1 taken along a plane that passes through silencing spaces 40 (i.e., along line B-B' in FIG. 4).

The fan motor 1 is used, for example, as an apparatus that supplies a cooling air flow to an interior of a room, such as a server room, in which a plurality of electronic devices are installed. The fan motor 1 may be used singly, or alternatively, a plurality of fan motors 1 may be used at the same time in combination. For example, a plurality of fan motors 1 may be installed in a single server room, and these fan motors 1 may be driven at the same time.

Referring to FIGS. 2 and 3, the fan motor 1 includes a motor 2, an impeller 3, and a housing 4. The fan motor 1 is an axial fan arranged to generate a downward air flow along a rotation axis 9. Once the fan motor 1 is driven, air is taken in from the upper side of the fan motor 1, i.e., from the inlet side, and the air is sent to the lower side of the fan motor 1, i.e., to the outlet side.

The motor 2 includes a stationary portion 21 and a rotating portion 22. The rotating portion 22 is supported to be rotatable with respect to the stationary portion 21. In addition, the rotating portion 22 is arranged to rotate about the rotation axis 9.

The stationary portion 21 includes a base portion 211, a stator 212, and two bearing members 213. The base portion 211 is arranged to extend along the rotation axis 9 to assume a cylindrical shape. The stator 212 is an armature fixed to an outer circumferential surface of the base portion 211. The stator 212 includes a stator core 51 and a plurality of coils 52. The stator core 51 includes a plurality of teeth arranged to extend radially. Each of the coils 52 is defined by a conducting wire wound around a separate one of the teeth.

A ball bearing is used as each of the bearing members 213 according to the present preferred embodiment. An outer race of each bearing member 213 is fixed to the base portion 211. In addition, an inner race of each bearing member 213 is fixed to a shaft 221, which will be described below, to support the shaft 221. The shaft 221 is thus supported to be rotatable with respect to the base portion 211.

The rotating portion 22 includes the shaft 221, a rotor cup 222, and a magnet 223. The shaft 221 is a columnar member arranged to extend along the rotation axis 9. The shaft 221 is rotatably supported by the base portion 211 through the bearing members 213. The shaft 221 is thus capable of rotating about the rotation axis 9.

The rotor cup 222 is a member in the shape of a covered cylinder, including a disk-shaped cover portion 53 and a tubular portion 54 arranged to extend from the cover portion 53 to the outlet side. For example, a metal, such as iron, which is a magnetic material, is used as a material of the rotor cup 222. A central portion of the cover portion 53 is fixed to the shaft 221. The rotor cup 222 is thus arranged to rotate together with the shaft 221. The cover portion 53 is arranged on the inlet side of the stationary portion 21. The tubular portion 54 is arranged radially outside of the stator 212. An impeller cup 31 of the impeller 3, which will be described below, is fixed to an upper surface and an outer circumferential surface of the rotor cup 222.

The impeller 3 includes the impeller cup 31 and a plurality of blades 32. The impeller cup 31 is a portion in the shape of a covered cylinder and arranged to cover the upper surface and the outer circumferential surface of the rotor cup 222. Each of the blades 32 is arranged to extend radially outward from an outer circumferential surface of the impeller cup 31. The blades 32 are arranged at substantially regular intervals in a circumferential direction. In the present preferred embodiment, the number of blades 32 is five. Note that the number of blades 32 may alternatively be two, three, or four, or six or more.

The impeller 3 according to the present preferred embodiment is molded in one piece by a resin injection molding process. That is, the impeller cup 31 and the blades 32 are defined integrally with each other. Note, however, that the impeller cup 31 and the blades 32 may alternatively be defined by separate members.

The housing 4 is a case arranged to house the motor 2 and the impeller 3 therein. The housing 4 includes a housing body 41 and a silencer portion 42. The housing body 41 includes an inner wall portion 61, a motor fixing portion 62, and a plurality of support ribs 63.

The inner wall portion 61 is a tubular portion arranged to extend from the inlet side (i.e., the upper side) to the outlet side (i.e., the lower side) along the rotation axis 9. The inner wall portion 61 is arranged to extend radially outside of the impeller 3 to substantially assume a cylindrical shape. The inner wall portion 61 is arranged to house at least a portion of the impeller 3 therein. That is, the inner wall portion 61 is arranged in an annular shape radially outside of the impeller 3 to surround the impeller 3.

The motor fixing portion 62 and the support ribs 63 are arranged below the stator 212. The base portion 211 of the motor 2 is fixed to the motor fixing portion 62. Each of the support ribs 63 is arranged to extend in a radial direction to join the inner wall portion 61 and the motor fixing portion 62 to each other. The position of the stationary portion 21 of the motor 2 with respect to the housing 4 is thus fixed. In the present preferred embodiment, the number of support ribs 63 is eleven. Arranging the number of blades 32 and the number of support ribs 63 to be relatively prime leads to a reduction in noise that occurs while the fan motor 1 is running. Note that the number of support ribs 63 may alternatively be in the range of 2 to 10 inclusive, or 12 or more.

The housing body 41 is defined in one piece by a resin injection molding process, for example. That is, the inner wall portion 61, the motor fixing portion 62, and the support ribs 63 are defined in one piece. Note, however, that the inner wall portion 61, the motor fixing portion 62, and the support ribs 63 may alternatively be defined by separate members. Also note that, although the base portion 211 of the motor 2 and the motor fixing portion 62 are defined by separate members in the present preferred embodiment, the base portion 211 and the motor fixing portion 62 may alternatively be defined integrally with each other.

At least a portion of the silencer portion 42 is arranged radially outside of the inner wall portion 61. The silencer portion 42 is arranged to define the silencing spaces 40, which will be described below, between the inner wall portion 61 and the silencer portion 42. The structure of the silencer portion 42 will be described in detail below.

The housing 4 includes an air inlet 11, which is an upper opening, and an air outlet 12, which is a lower opening. The air inlet 11 is arranged on the upper side of the impeller 3. The air outlet 12 is arranged on the lower side of the impeller 3.

A space extending in the axial direction from the air inlet 11 to the air outlet 12, that is, a space radially inside of the inner wall portion 61 and the silencer portion 42, defines a wind channel 10 through which air flows pass.

In the fan motor 1 as described above, electric drive currents are supplied to the coils 52 of the stator 212, and as a result, magnetic flux is generated around the stator core 51 in accordance with the electric drive currents. Then, interaction between the magnetic flux of the stator core 51 and that of the magnet 223 produces a circumferential torque, so that the rotating portion 22 is caused to rotate about the rotation axis 9. Once the rotating portion 22 starts rotating, the impeller 3 also starts rotating about the rotation axis 9 together with the rotating portion 22. As a result, an air flow which passes axially downward is generated in the wind channel 10 radially inside of the housing 4.

The generation of the air flow by the impeller 3 causes air on the upper side of the fan motor 1 to be drawn into a space inside of the housing 4 through the air inlet 11. At the same time, air inside of the housing 4 is discharged out of the housing 4 through the air outlet 12.

Figure 4:
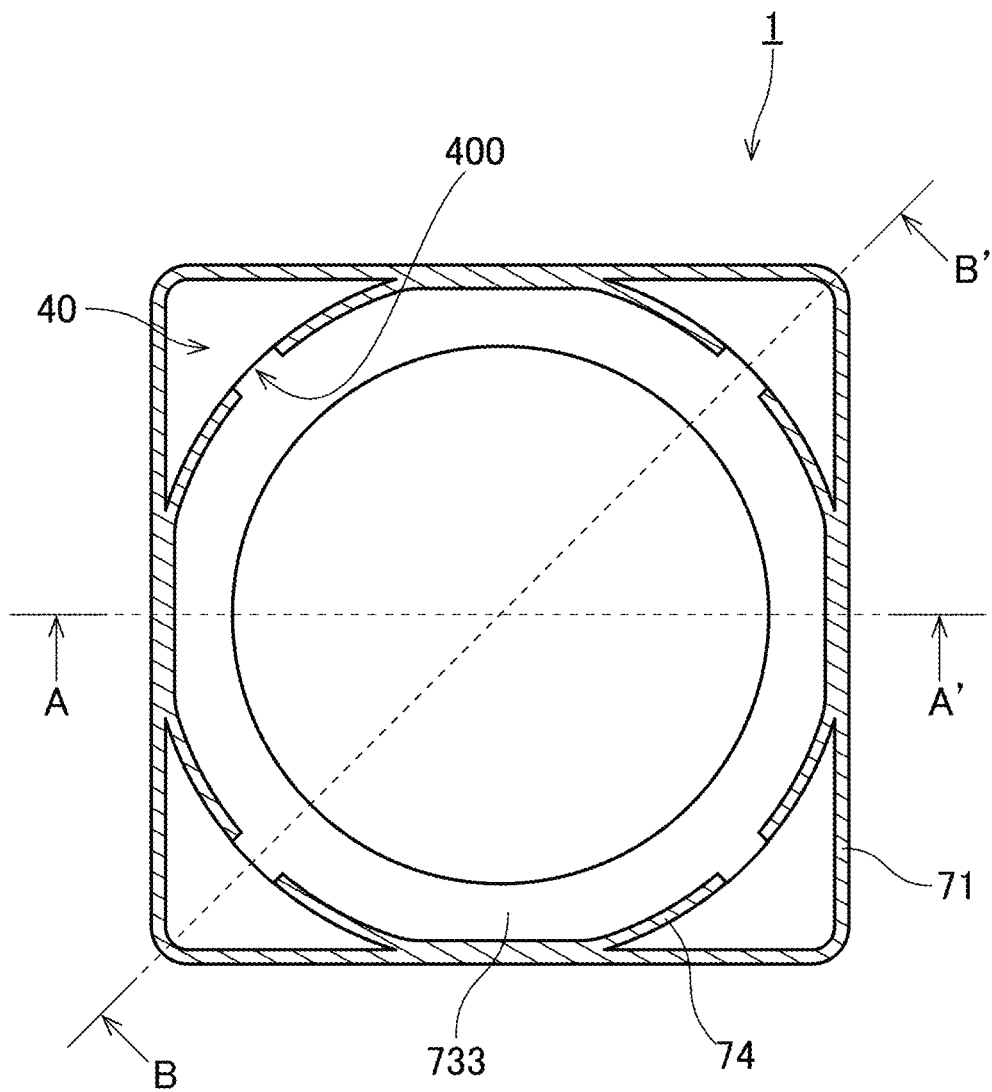
FIG. 4 is a sectional view of the fan motor according to the first preferred embodiment of the present invention.
Figure 5:
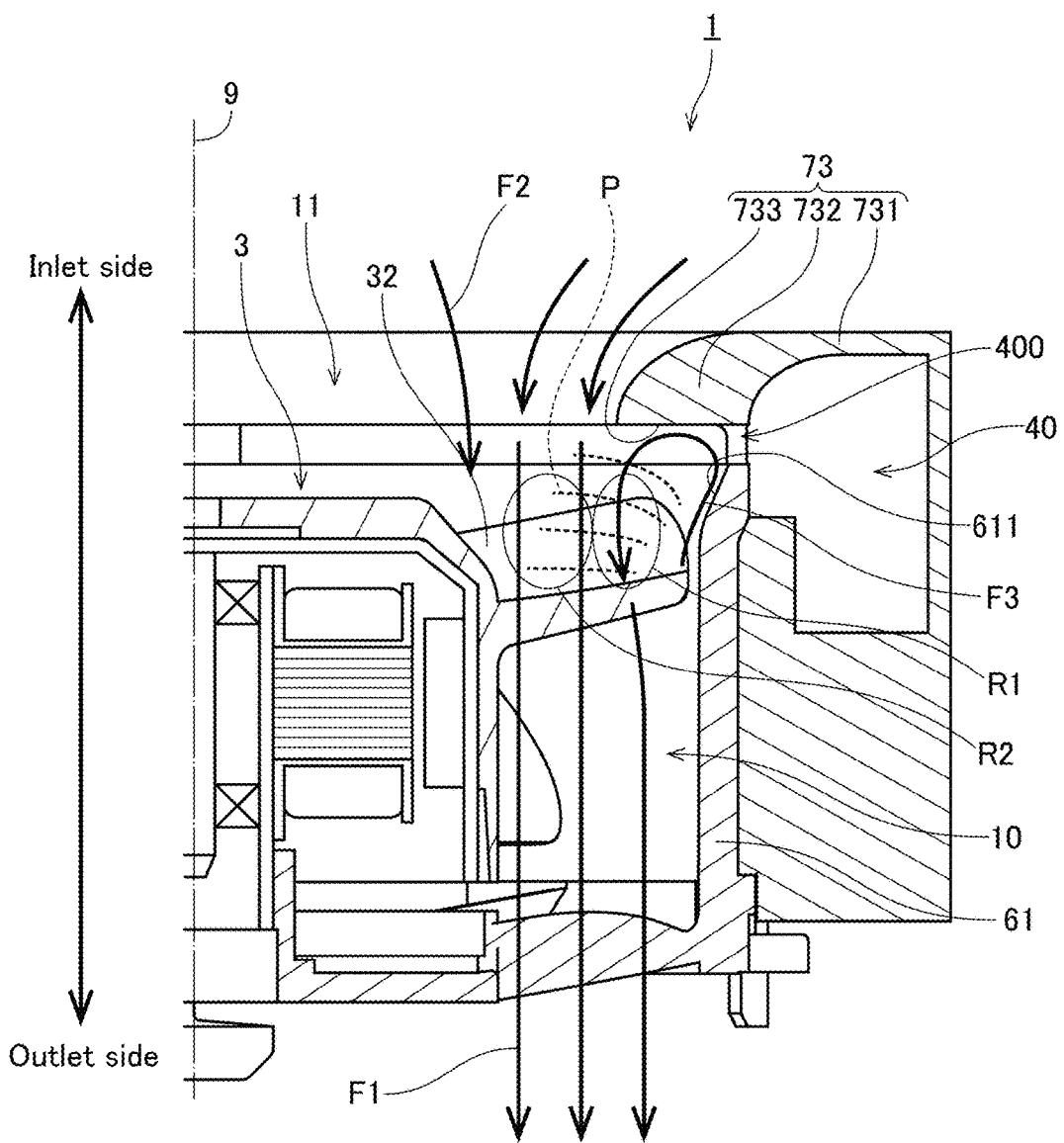
FIG. 5 is a sectional view of the fan motor according to the first preferred embodiment of the present invention.

Next, a silencing mechanism of the fan motor 1 will now be described below. FIG. 4 is a horizontal sectional view of the fan motor 1 taken along line C-C'. FIG. 5 is a partial vertical sectional view of the fan motor 1, illustrating flows of air.

Referring to FIGS. 2 and 3, the silencer portion 42 includes an outer wall portion 71, a bottom portion 72, a flange portion 73, and arc wall portions 74.

The outer wall portion 71 is arranged to extend along the rotation axis 9 radially outside of the inner wall portion 61 to assume a tubular shape. Referring to FIGS. 1 and 4, an outer circumferential surface of the outer wall portion 71 according to the present preferred embodiment is substantially square, having four sides, when viewed in the axial direction. The outer wall portion 71 is arranged most radially outward in the housing 4. As a result, the housing 4 has an outer circumferential surface which is substantially square when viewed in the axial direction.

Referring to FIGS. 2 and 4, an outer circumferential surface of the inner wall portion 61 and an inner circumferential surface of the outer wall portion 71 are in contact with each other at portions of the outer wall portion 71 which are at a small radial distance from the rotation axis 9. More specifically, the outer wall portion 71 is in contact with the inner wall portion 61 at a circumferential middle of each of the four sides of the outer wall portion 71 and its vicinity.

Meanwhile, referring to FIGS. 3 and 4, the outer circumferential surface of the inner wall portion 61 and the inner circumferential surface of the outer wall portion 71 are radially spaced from each other at portions of the outer wall portion 71 which are at a large radial distance from the rotation axis 9. More specifically, each of corner portions of the outer wall portion 71 and its vicinity are spaced from the inner wall portion 61. Gaps defined between the inner wall portion 61 and the outer wall portion 71 define the silencing spaces 40.

The bottom portion 72 is arranged to extend radially inward from the outer wall portion 71 to the inner wall portion 61 below the silencing spaces 40.

The flange portion 73 is arranged to extend radially inward from an upper end, i.e., an inlet-side end portion, of the outer wall portion 71. Referring to FIG. 5, the flange portion 73 includes a plate portion 731 and a slanting portion 732. The plate portion 731 is arranged to extend radially above the silencing spaces 40. The slanting portion 732 is arranged to extend radially inward and downward from the plate portion 731. That is, in a radially inner end portion of the flange portion 73, the slanting portion 732 is arranged to slant from the inlet side to the outlet side as the slanting portion 732 extends radially inward. The slanting portion 732 according to the present preferred embodiment includes an annular bottom surface 733 extending radially.

Referring to FIG. 3, each arc wall portion 74 is arranged to extend downward from the bottom surface 733 of the flange portion 73. The arc wall portions 74 are spaced from one another in the circumferential direction. Referring to FIG. 4, each arc wall portion 74 is arranged in the shape of a circular arc with the rotation axis 9 as a center when viewed in the axial direction. Each of both circumferential ends of the arc wall portion 74 defines a portion of a communicating opening 400, which will be described below. The arc wall portion 74 is radially joined to the outer wall portion 71 at a circumferential middle of the arc wall portion 74 and its vicinity. In addition, a lower end surface of the arc wall portion 74 is in contact with an upper end surface of the inner wall portion 61 as illustrated in FIG. 3.

With the above-described structure, the silencer portion 42 defines the four silencing spaces 40 between the inner wall portion 61 and the silencer portion 42 as illustrated in FIGS. 3 and 4. As illustrated in FIGS. 2 to 4, each silencing space 40 is arranged to cover only a portion of the circumferential extent of the inner wall portion 61.

Each communicating opening 400 is defined by the upper end surface of the inner wall portion 61, the bottom surface 733 of the flange portion 73, and circumferential end surfaces of the arc wall portions 74. As illustrated in FIGS. 2 to 4, the communicating opening 400 is arranged to bring the space inside of the inner wall portion 61 into communication with the corresponding silencing space 40. That is, the communicating opening 400 is arranged to bring the wind channel 10, which is defined inside of the housing 4, into communication with the corresponding silencing space 40.

Each silencing space 40 is defined by the outer circumferential surface of the inner wall portion 61, the inner circumferential surface of the outer wall portion 71, an upper surface of the bottom portion 72, a lower surface of the flange portion 73, and outer circumferential surfaces of the corresponding arc wall portions 74. That is, the silencing space 40 is defined between the silencer portion 42 and the inner wall portion 61.

Once the motor 2 is driven, the impeller 3 is caused to rotate to produce air flows F1, each of which passes axially downward from the air inlet 11 toward the air outlet 12, in the wind channel 10 as indicated by solid line arrows in FIG. 5. Once the air flows F1 are produced in the wind channel 10, the air on the upper side of the fan motor 1 is drawn into the wind channel 10 through the air inlet 11. As a result, air flows F2, each of which passes downward from above the air inlet 11, are produced in the vicinity of the air inlet 11. At this time, the slanting portion 732 of the flange portion 73 smoothly guides the air on the upper side of the fan motor 1 into the wind channel 10.

At this time, as indicated by a solid line arrow in FIG. 5, a counterflow F3, which passes upward along an inner circumferential surface of the inner wall portion 61, is produced radially outside of the blades 32. The counterflow F3 first passes upward from the outlet side toward the inlet side, then turns in the vicinity of the bottom surface 733 of the flange portion 73, and then passes downward from the inlet side toward the outlet side. Accordingly, a region R1 in which the air flow F1, which passes downward, and the counterflow F3, which passes downward after the turn, join is a region in which air flows fastest near the center in the wind channel 10.

Meanwhile, an upwardly traveling component of a sound wave caused by a pressure fluctuation that occurs on a surface of each blade 32 of the impeller 3 due to the rotation of the impeller 3 has a speed equal to the speed of sound minus the speed of the air flow passing downward. In a region R2 inside of the region R1, the air flow F1 has a speed lower than that of a combination of the air flow F1 and the counterflow F3 in the region R1. Therefore, sound wave components traveling upward from each blade 32 have lower speeds in the region R2 than in the region R1. As a result, wavefronts P of sound waves traveling upward from each blade 32 are slanted radially outward as indicated by broken lines in FIG. 5.

This action causes more components of the sound waves traveling upward from each blade 32 to travel radially outward rather than toward the air inlet 11. Therefore, portions of the sound waves traveling upward from each blade 32 propagate into each silencing space 40 through the corresponding communicating opening 400. That is, a portion of noise that occurs on the inlet side (i.e., the upper side) of each blade 32 and travels toward the air inlet 11 is guided into each silencing space 40. This results in a reduction in noise that propagates out of the fan motor 1 through the air inlet 11, reducing sound waves that travel from each blade 32 toward the air inlet 11. Sound waves that have propagated into each silencing space 40 come to vary in phase and undergo energy dissipation because of an irregular spatial configuration in the silencing space 40, so that a silencing effect is achieved. A reduction in noise that leaks out through the air inlet 11 can thus be achieved.

In the present preferred embodiment, each communicating opening 400 is arranged to have minimum axial and circumferential dimensions. Each silencing space 40 therefore has a large volume compared to the volume of air pushed into the silencing space 40 through the communicating opening 400. Accordingly, when a sound wave propagates from the wind channel 10 into the silencing space 40 through the communicating opening 400, an open-end reflection occurs, and a positive pressure wave of the sound wave is therefore reflected as a negative pressure wave. This negative pressure wave resulting from the reflection is opposite in phase to a sound wave that is thereafter to propagate from the surface of any blade 32 of the impeller 3 directly to a space on the outer side of the air inlet 11. Accordingly, this sound wave and the negative pressure wave interfere with each other to significantly reduce the level of noise that propagates to the space on the outer side of the air inlet 11. A further reduction in the noise that leaks out through the air inlet 11 is thus achieved.

As described above, noise occurs on the surface of each blade 32 of the impeller 3, and the noise leaks out of the fan motor 1 through the air inlet 11. Therefore, the communicating opening 400 for each silencing space 40 is preferably arranged on the upper side, i.e., the inlet side, of the impeller 3 as in the present preferred embodiment.

Each silencing space 40 is arranged to cover only a portion of the circumferential extent of the inner wall portion 61. This allows the silencing spaces 40 to be arranged in dead spaces around the inner wall portion 61, the dead spaces lying at four corner portions of the housing 4. Thus, the silencing spaces 40 are arranged only in the dead spaces, which cover only a part of the circumferential extent of the inner wall portion 61, instead of being arranged to cover the entire circumferential extent of the inner wall portion 61, and this contributes to reducing noise without increasing the diameter of the fan motor 1. Accordingly, a reduction in noise can be achieved without the need to increase the size of a space in which the fan motor 1 is installed.

In particular, in the present preferred embodiment, the four silencing spaces 40 are arranged at regular intervals in the circumferential direction. Meanwhile, as described above, the housing 4 has the outer circumferential surface which is substantially square when viewed in the axial direction. Each of the four silencing spaces 40 is arranged at a position which overlaps with a separate one of four corner portions of the outer circumferential surface of the housing 4 when viewed in a radial direction. The silencing spaces 40 can thus be arranged without an increase in the size of the housing 4.

In the present preferred embodiment, the flange portion 73 is arranged at a level higher than that of an upper end of each blade 32. That is, the flange portion 73 is arranged on the inlet side of the blades 32. This allows an inlet-side end portion of each communicating opening to be arranged on the inlet side of the blades 32. This makes it easier for the noise that occurs on the inlet side (i.e., the upper side) of each blade 32 and travels toward the air inlet 11 to be guided into each silencing space 40. This leads to an improvement in the silencing effect produced by the silencing space 40.

In addition, an upper end portion of the inner wall portion 61 is arranged at a level higher than that of the upper end of each blade 32. That is, an end portion of each blade 32 on the inlet side is arranged on the outlet side of an end portion of the inner wall portion 61 on the inlet side. Each communicating opening 400 is thus arranged on the inlet side of the blades 32. This makes it still easier for the noise that occurs on the inlet side of each blade 32 and travels toward the air inlet 11 to be guided into each silencing space 40. This leads to a further improvement in the silencing effect produced by the silencing space 40.

In the present preferred embodiment, the flange portion 73 is arranged to have an inside diameter smaller than the outside diameter of the blades 32. This makes it easier for the counterflow F3, which passes upward along the inner circumferential surface of the inner wall portion 61, to strike against the flange portion 73 and make a turn. The counterflow F3 makes a local turn, reducing the likelihood that the counterflow F3 will be directed to the outer side of the air inlet 11. This leads to an improvement in P-Q characteristics (i.e., flow rate-static pressure characteristics) of the fan motor 1. Note that the flange portion 73 may alternatively be arranged to have an inside diameter equal to or greater than the outside diameter of the blades 32.

Here, each silencing space 40 is in communication with the space outside of the silencing space 40 only through the one communicating opening 400. That is, the silencing space 40 is a closed space that is not in communication with any space other than the wind channel 10. Therefore, the air in the wind channel does not leak out of the housing 4 through the silencing space 40. Therefore, a worsening of the P-Q characteristics can be prevented.

In addition, referring to FIG. 5, the inner circumferential surface of the inner wall portion 61 includes, in an upper end thereof, an increased diameter portion 611 arranged to increase in a diameter with increasing height. That is, in an end portion of the inner circumferential surface of the inner wall portion 61 on the inlet side, the increased diameter portion 611 is arranged to gradually increase in a diameter from the outlet side toward the inlet side. This makes it still easier for the noise that occurs on the inlet side of each blade 32 and travels toward the air inlet 11 to be guided into each silencing space 40. In addition, a counterflow F3 which passes upward along the inner circumferential surface of the inner wall portion 61 from around each blade 32 is guided to each communicating opening 400 along the increased diameter portion 611. The counterflow F3 makes a local turn after passing upward along the increased diameter portion 611. Thanks to the increased diameter portion 611 of the inner circumferential surface of the inner wall portion 61, the counterflow F3 can make a smoother turn. This contributes to more effectively preventing the counterflow F3 from being directed to the outer side of the air inlet 11, leading to a further improvement in the P-Q characteristics of the fan motor 1.

Figure 6:
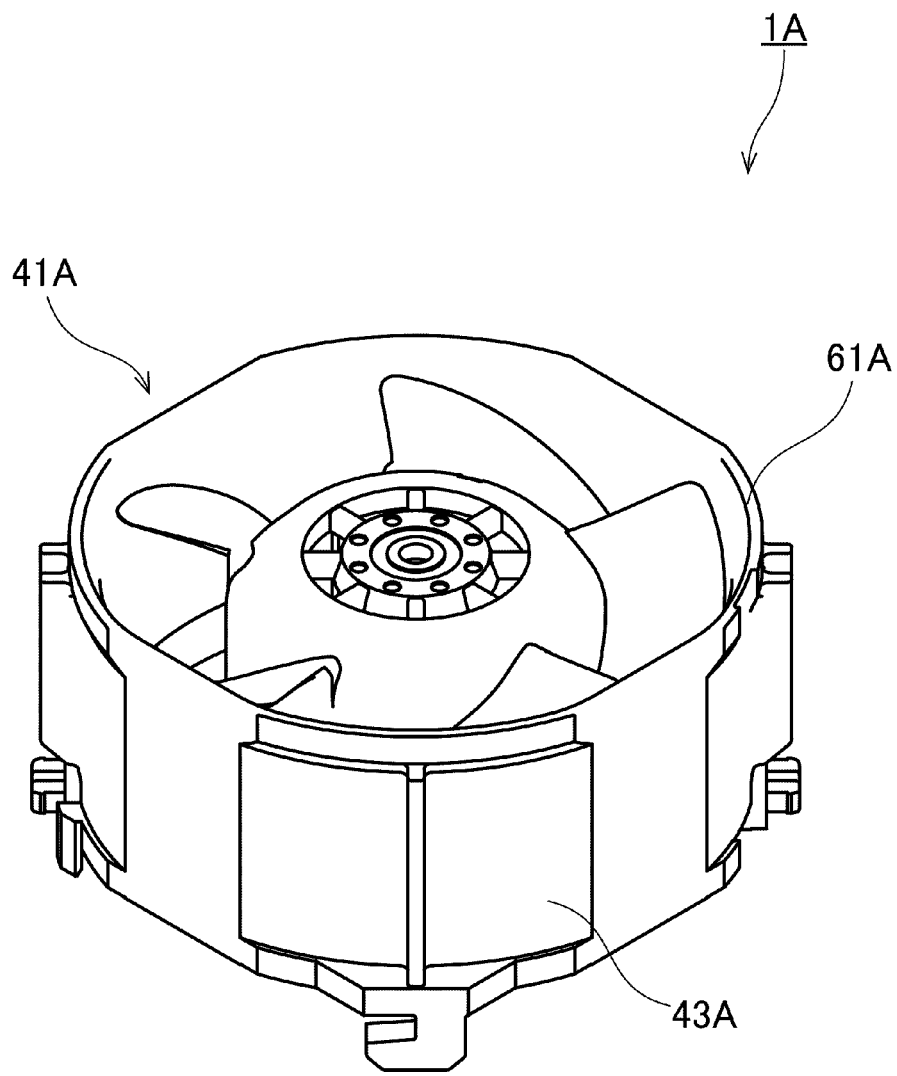
FIG. 6 is a perspective view of a known fan motor.

Here, how noise characteristics and the P-Q characteristics change depending on whether the silencing spaces are provided will now be described below. FIG. 6 is a perspective view of a known fan motor 1A according to a comparative example. Each of FIGS. 7 and 8 is a sectional view of the fan motor 1A.

Figure 7:
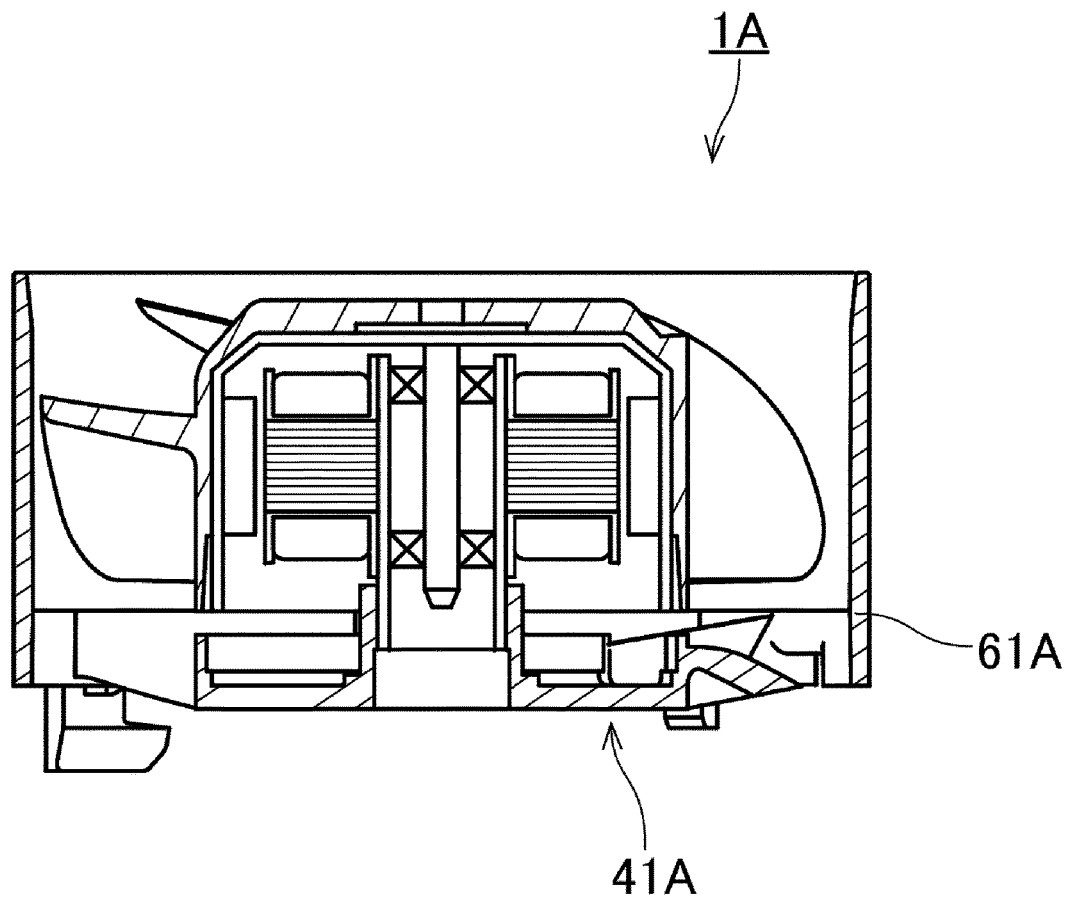
FIG. 7 is a sectional view of the known fan motor.
Figure 8:
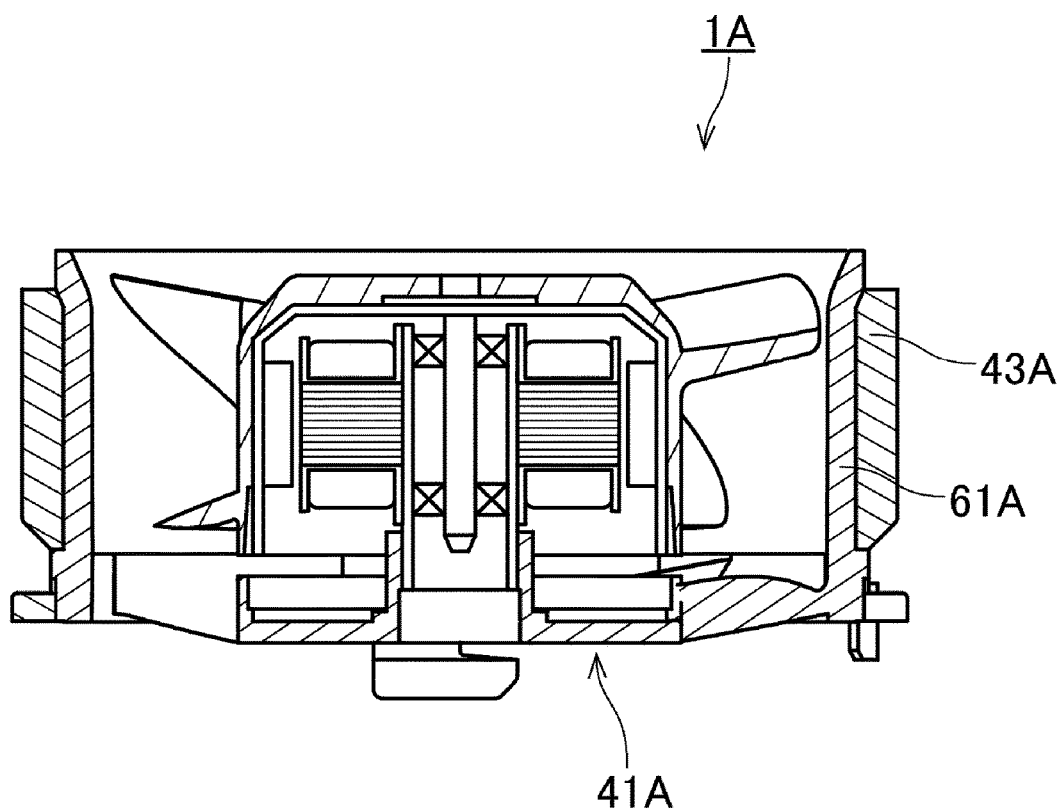
FIG. 8 is a sectional view of the known fan motor.

Referring to FIGS. 6 to 8, the fan motor 1A does not include the silencer portion. In addition, the fan motor 1A includes a member 43A used for attachment on the outer side of an inner wall portion 61A of a housing body 41A. The fan motor 1A is otherwise similar to the fan motor 1 according to the first preferred embodiment.

Figure 9:
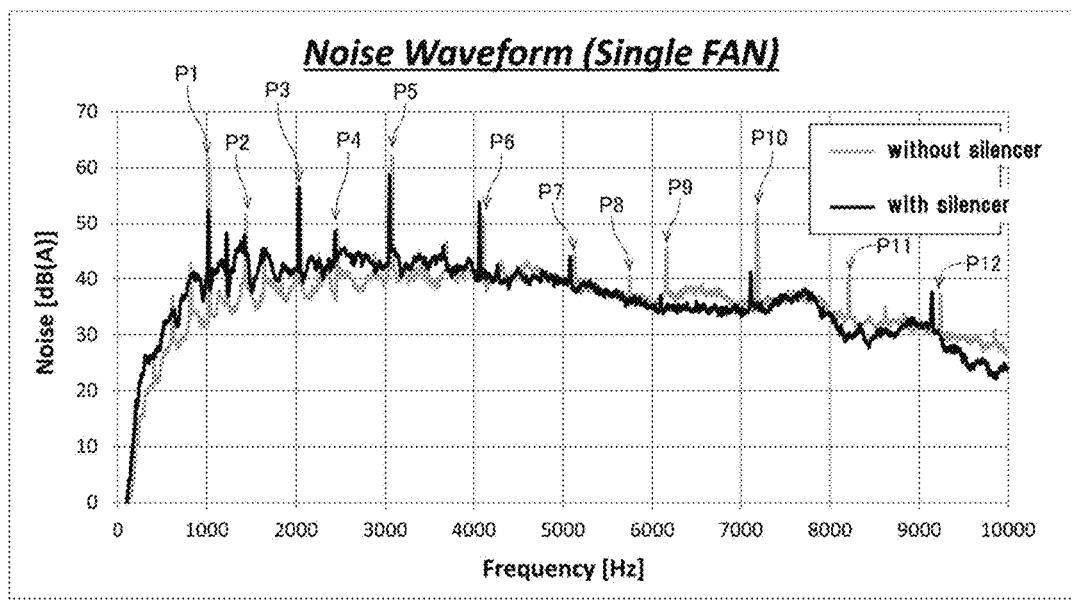
FIG. 9 is a diagram illustrating frequency characteristics of noise with respect to the known fan motor and the fan motor according to the first preferred embodiment.

FIG. 9 is a diagram illustrating frequency characteristics of noise on the inlet side with respect to the known fan motor 1A and the fan motor 1 according to the present preferred embodiment. In FIG. 9, data as to the known fan motor 1A is labeled as "without silencer", while data as to the fan motor 1 according to the present preferred embodiment is labeled as "with silencer".

In FIG. 9, some characteristic peaks with respect to the known fan motor 1A (without silencer) are labeled as P1 to P12. Referring to FIG. 9, of peaks P1 to P12, peaks P1, P2, P5, and P10 are reduced in noise level with respect to the fan motor (with silencer) according to the present preferred embodiment. In addition, peaks P8, P9, and P11 can hardly be observed with respect to the fan motor 1. Meanwhile, peaks P3, P4, P7, and P12 are substantially equal in noise level between the fan motors 1A and 1. Peak P6 is increased in noise level with respect to the fan motor 1.

To evaluate the noise levels at the above peaks with respect to the known fan motor 1A and the fan motor 1 according to the present preferred embodiment as a whole, it can be said that the noise levels at the peaks are generally reduced with respect to the fan motor 1. Humans perceive noise as more annoying as differences between baseline and peak components of the noise are greater. Accordingly, the fan motor 1 according to the present preferred embodiment, in which the noise levels at the peaks are generally reduced when compared to the case of the known fan motor 1A, is able to achieve a significant enhancement in auditory feeling of a user.

Meanwhile, in a low-frequency region (up to 4000 [Hz]), the noise level of a baseline of noise is slightly higher in the case of the fan motor 1 according to the present preferred embodiment than in the case of the known fan motor 1A. With the noise levels at the peaks being the same, smaller differences between the noise level of the baseline and the noise levels at the peaks lead to an enhancement in the auditory feeling of the user, even when the overall noise level has been increased. Therefore, the fan motor 1 according to the present preferred embodiment, in which the differences between the noise level of the baseline and the noise levels at the peaks in the low-frequency region are smaller than in the case of the known fan motor 1A, is able to achieve a further enhancement in the auditory feeling of the user.

Figure 10:
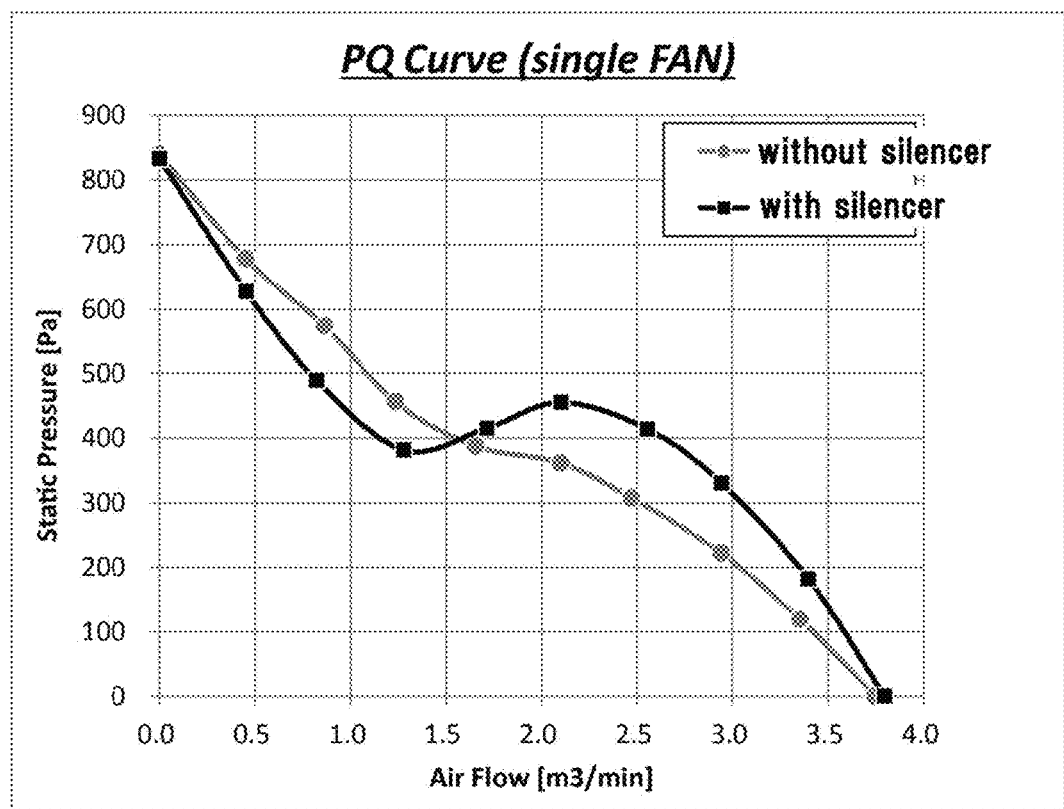
FIG. 10 is a diagram illustrating P-Q curves of the known fan motor and the fan motor according to the first preferred embodiment.
Figure 11:
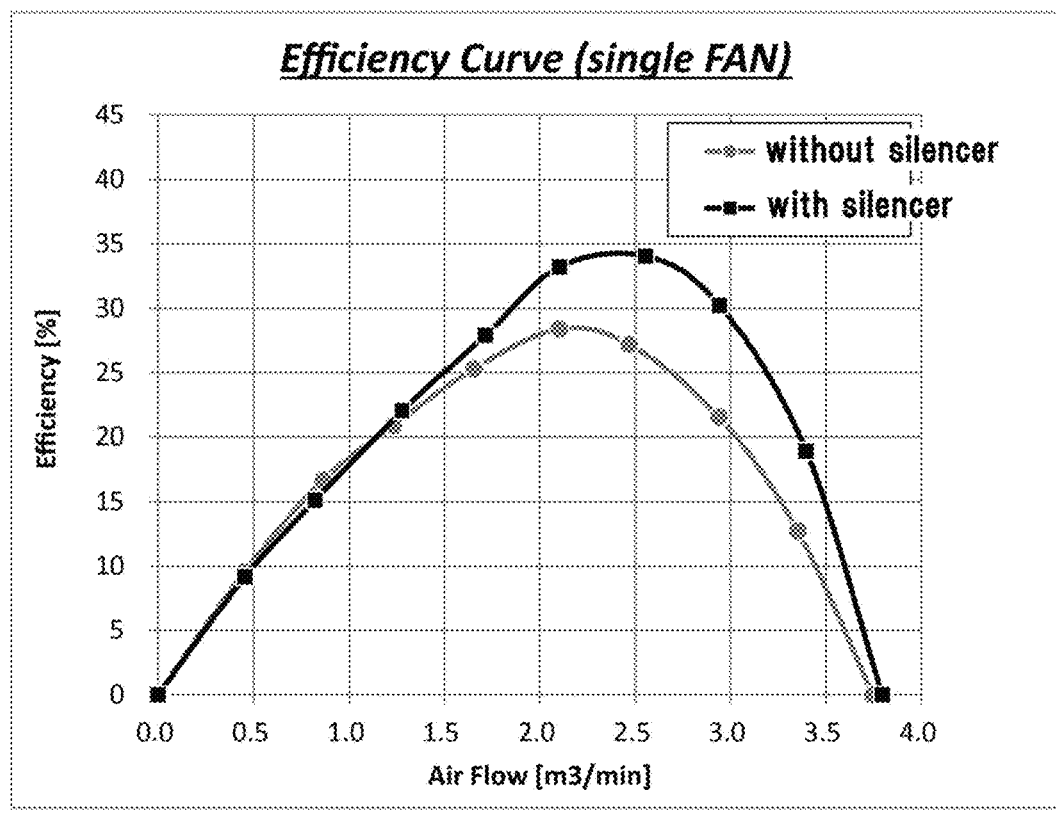
FIG. 11 is a diagram illustrating efficiency curves of the known fan motor and the fan motor according to the first preferred embodiment.

FIG. 10 is a diagram illustrating P-Q curves of the known fan motor 1A and the fan motor 1 according to the present preferred embodiment. FIG. 11 is a diagram illustrating efficiency curves of the known fan motor 1A and the fan motor 1 according to the present preferred embodiment. In each of FIGS. 10 and 11, data as to the known fan motor 1A is labeled as "without silencer", while data as to the fan motor 1 according to the present preferred embodiment is labeled as "with silencer".

As shown in FIG. 10, the static pressure of the fan motor 1, which includes the silencer portion 42, is higher than the static pressure of the fan motor 1A, which does not include the silencer portion, when the flow rate is about 1.7 [m$^3$/min] or higher. In addition, as shown in FIG. 11, the efficiency of the fan motor 1, which includes the silencer portion 42, is higher than the efficiency of the fan motor 1A, which does not include the silencer portion, when the flow rate is about 1.1 [m$^3$/min] or higher. Thus, it can be observed that provision of the silencer portion 42 improves the P-Q characteristics of the fan motor 1 in a high flow rate region.

As described above, defining the silencing spaces 40 by the provision of the silencer portion 42 leads to a reduction in noise and an improvement in the P-Q characteristics. Meanwhile, the dead spaces around the motor can be utilized by defining the silencing spaces 40 such that the silencing spaces 40 cover only a part of the circumferential extent of the inner wall portion 61. That is, the silencing spaces 40 can be provided without an increase in the size of the fan motor 1.

While preferred embodiments of the present invention have been described above, the present invention is not limited to the above-described preferred embodiments.

Figure 12:
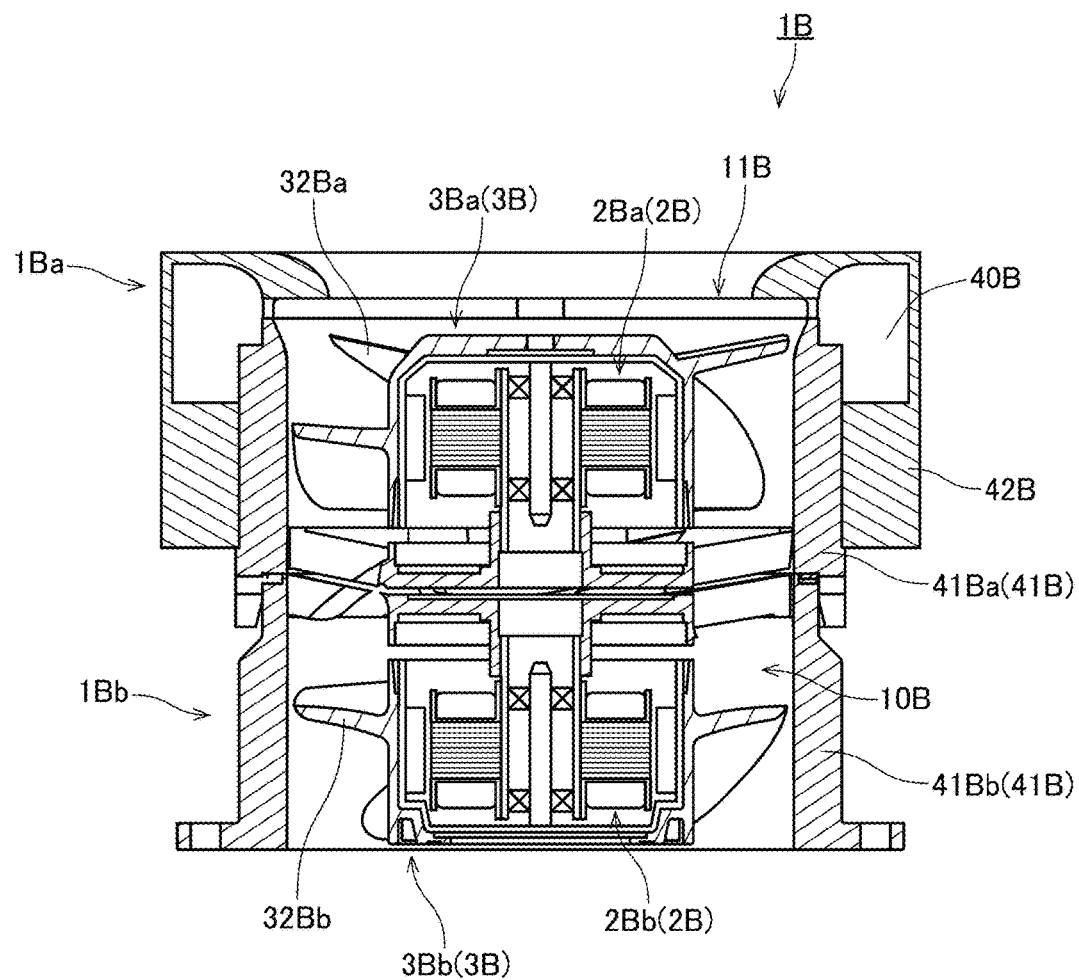
FIG. 12 is a sectional view of a fan motor according to a second preferred embodiment of the present invention.

FIG. 12 is a vertical sectional view of a fan motor 1B according to a second preferred embodiment of the present invention. The fan motor 1B according to the preferred embodiment illustrated in FIG. 12 is a double fan including an inlet-side fan 1Ba and an outlet-side fan 1Bb connected in series.

The fan motor 1B includes two motors 2B, two impellers 3B, two housing bodies 41B, and one silencer portion 42B.

The two motors 2B include a first motor 2Ba and a second motor 2Bb. The two impellers 3B include a first impeller 3Ba and a second impeller 3Bb. The two housing bodies 41B include a first housing body 41Ba and a second housing body 41Bb.

The first motor 2Ba, the first impeller 3Ba, the first housing body 41Ba, and the silencer portion 42B together form the inlet-side fan 1Ba. The second motor 2Bb, the second impeller 3Bb, and the second housing body 41Bb together form the outlet-side fan 1Bb.

The first and second housing bodies 41Ba and 41Bb together define a wind channel 10B extending in the axial direction inside thereof. In addition, in the wind channel 10B, the first motor 2Ba and the first impeller 3Ba of the inlet-side fan 1Ba and the second motor 2Bb and the second impeller 3Bb of the outlet-side fan 1Bb are arranged in series in the axial direction. Use of the two impellers 3Ba and 3Bb contributes to increasing static pressure of an air flow generated.

The fan motor 1B according to the preferred embodiment illustrated in FIG. 12 is a so-called counter-rotating axial fan. That is, a plurality of blades 32Ba of the first impeller 3Ba and a plurality of blades 32Bb of the second impeller 3Bb are slanted in mutually opposite directions. In addition, the first and second impellers 3Ba and 3Bb are arranged to rotate in mutually opposite directions while the fan motor 1B is running. As a result, each of the first and second impellers 3Ba and 3Bb generates an axially downward air flow. When the first and second impellers 3Ba and 3Bb are arranged to rotate in opposite directions as described above, straightness of the air flow is improved. This leads to an additional increase in static pressure while the fan motor 1B is running.

In the preferred embodiment illustrated in FIG. 12, the inlet-side fan 1Ba includes the silencer portion 42B. Thus, a portion of noise which is caused by the impellers 3Ba and 3Bb and travels toward an air inlet 11B is guided into a silencing space 40B. A portion of the noise guided into the silencing space 40B is thus silenced. In addition, an open-end reflection by the silencing space 40B reduces noise that leaks out through the air inlet 11B. This leads to a reduction in noise in the fan motor 1B.

A fan motor which includes two or more impellers in a wind channel, as does the fan motor 1B according to the preferred embodiment illustrated in FIG. 12, tends to produce greater noise than a fan motor including only one impeller. This makes the present invention particularly useful. Moreover, a so-called counter-rotating fan motor, like the fan motor 1B according to the preferred embodiment illustrated in FIG. 12, tends to produce greater noise than a double fan including two impellers which are slanted in the same direction and are arranged to rotate in the same direction. This makes the present invention still more useful. Note that a preferred embodiment of the present invention may be applied to a fan motor including three or more impellers in a wind channel.

Although, in the preferred embodiment illustrated in FIG. 12, the plurality of impellers are arranged in series in the one wind channel, this is not essential to the present invention. A preferred embodiment of the present invention may be applied to a fan motor in which a plurality of impellers are arranged in parallel in one wind channel.

Figure 13:
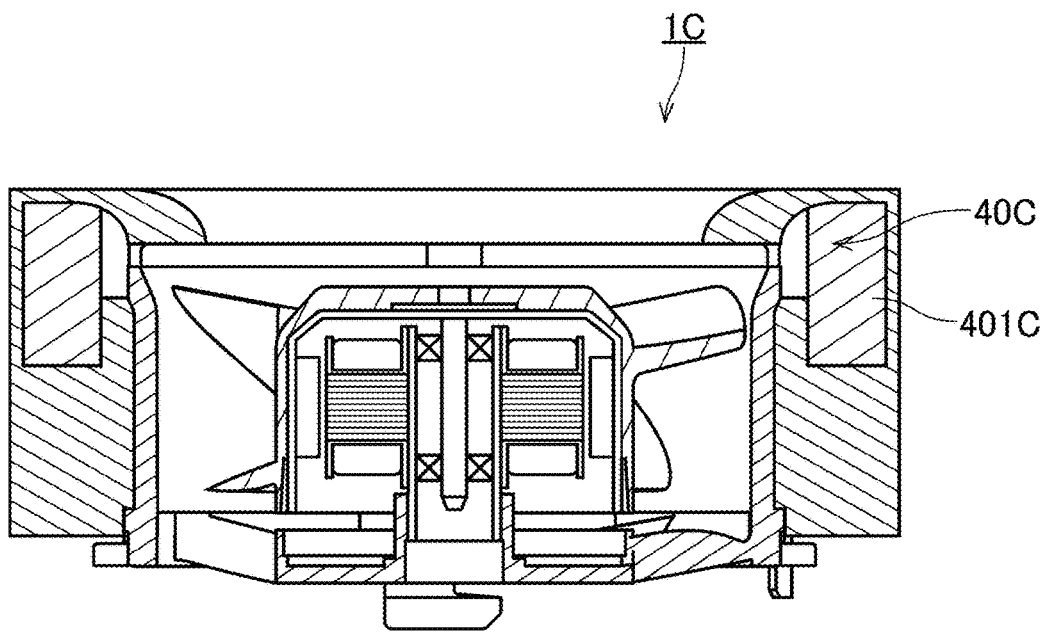
FIG. 13 is a sectional view of a fan motor according to a third preferred embodiment of the present invention.

FIG. 13 is a vertical sectional view of a fan motor 1C according to a third preferred embodiment of the present invention. In the fan motor 1C, a sound-absorbing sponge 401C is arranged in a silencing space 40C. The fan motor 10 is otherwise similar to the fan motor 1 according to the first preferred embodiment. A sound absorber defined by a porous elastic member, for example, is used as the sound-absorbing sponge 401C.

Figure 14:
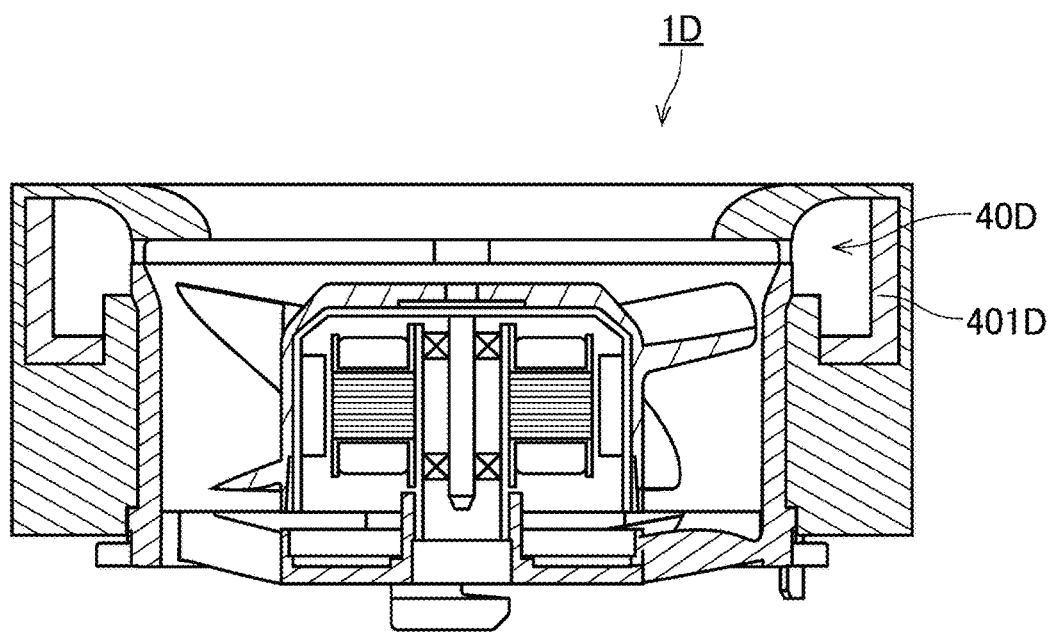
FIG. 14 is a sectional view of a fan motor according to a fourth preferred embodiment of the present invention.

FIG. 14 is a vertical sectional view of a fan motor 1D according to a fourth preferred embodiment of the present invention. In the fan motor 1D, a sound-absorbing sponge 401D is arranged in a silencing space 40D. The fan motor 1D is otherwise similar to the fan motor 1 according to the first preferred embodiment.

When the sound-absorbing sponge is arranged in the silencing space as in each of the preferred embodiments illustrated in FIGS. 13 and 14, noise guided into the silencing space is absorbed by the sound-absorbing sponge, resulting in reduced noise. This improves a silencing effect produced by a silencer portion.

In the fan motor 1C according to the preferred embodiment illustrated in FIG. 13, the sound-absorbing sponge 401C is arranged to occupy the most part of the silencing space 40C. That is, the sound-absorbing sponge 401C is arranged to have a large thickness. On the other hand, in the fan motor 1D according to the preferred embodiment illustrated in FIG. 14, the sound-absorbing sponge 401D is arranged to extend along a wall surface defining the silencing space 40C with a specific thickness.

As the thickness of the sound-absorbing sponge increases, the weight of the sound-absorbing sponge increases, and the improvement in the silencing effect can be achieved for noise at lower frequencies. Therefore, the thickness and shape of the sound-absorbing sponge may be adjusted in accordance with a frequency range for which the silencing effect is to be improved.

Figure 15:
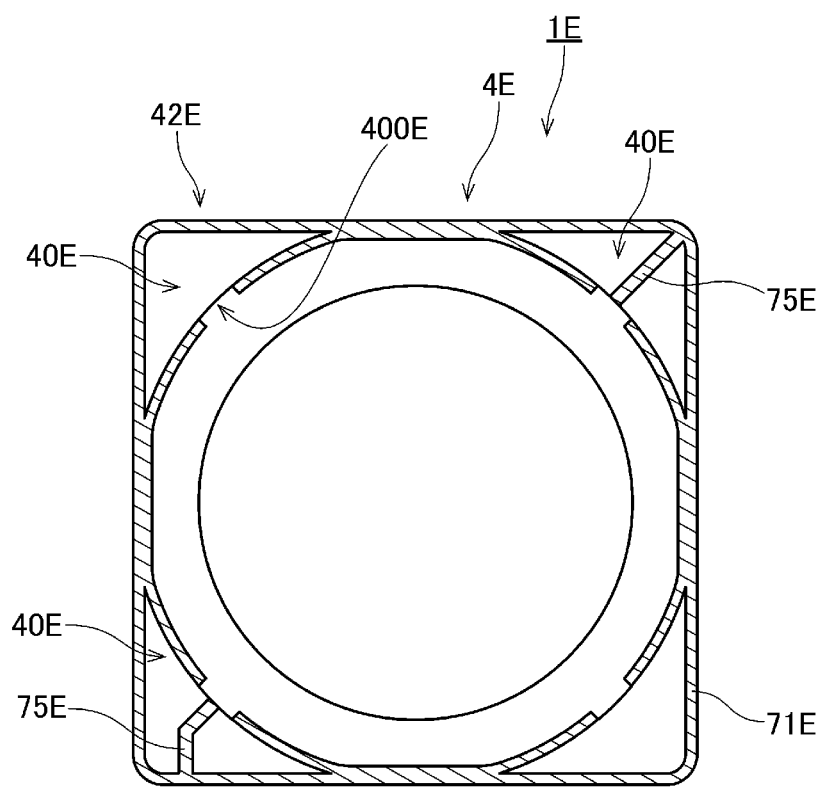
FIG. 15 is a sectional view of a fan motor according to a fifth preferred embodiment of the present invention.

FIG. 15 is a horizontal sectional view of a fan motor 1E according to a fifth preferred embodiment of the present invention. In the fan motor 1E, a housing 4E includes a partitioning portion 75E arranged to partition a silencing space 40E in the circumferential direction. More specifically, a silencer portion 42E includes the partitioning portion 75E. The partitioning portion 75E is arranged to extend in a radial direction from an inner surface of an outer wall portion 71E to a vicinity of a communicating opening 400E.

The partitioning portion 75E can be arranged to divide the silencing space 40E into sections each of which has an appropriate size. The silencing space 40E varies in a frequency range for which a significant silencing effect can be produced depending on the size thereof. Therefore, the frequency region for which the silencing effect is to be achieved can be adjusted by appropriately adjusting the size of each silencing space 40E with the provision of the partitioning portion 75E.

Figure 16:
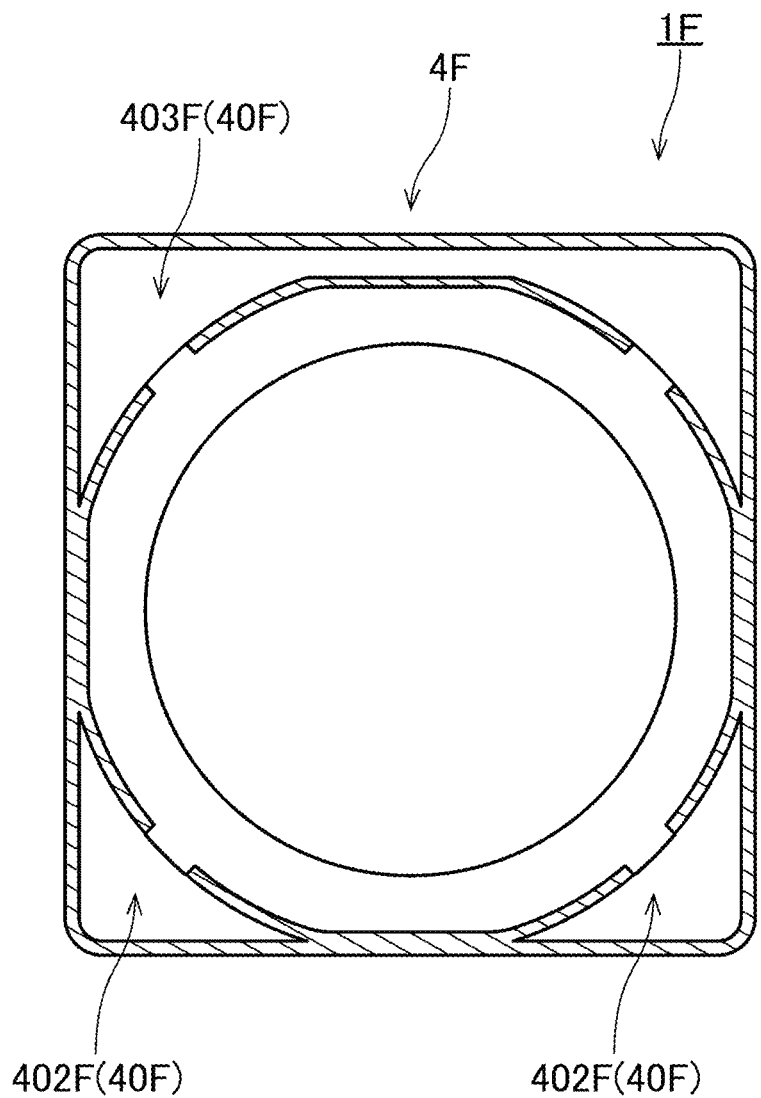
FIG. 16 is a sectional view of a fan motor according to a sixth preferred embodiment of the present invention.

FIG. 16 is a horizontal sectional view of a fan motor 1F according to a sixth preferred embodiment of the present invention. In the fan motor 1F, a housing 4F includes three silencing spaces 40F. The housing 4F of the fan motor 1F includes an outer circumferential surface which is substantially rectangular when viewed in the axial direction. The three silencing spaces 40F include two silencing spaces 402F each of which is arranged at a position which overlaps with a separate one of four corner portions of the outer circumferential surface of the housing 4F when viewed in a radial direction. The remaining one of the three silencing spaces 40F is a silencing space 403F, which includes portions arranged to overlap with the two remaining corner portions of the outer circumferential surface of the housing 4F when viewed in a radial direction, and a portion that joins the two corner portions in the circumferential direction.

In the preferred embodiment illustrated in FIG. 16, the sizes of the silencing spaces 40F are adjusted by arranging the silencing space 403F to extend from one of the two corner portions to the other. The frequency region for which the silencing effect is to be achieved can thus be adjusted.

Figure 17:
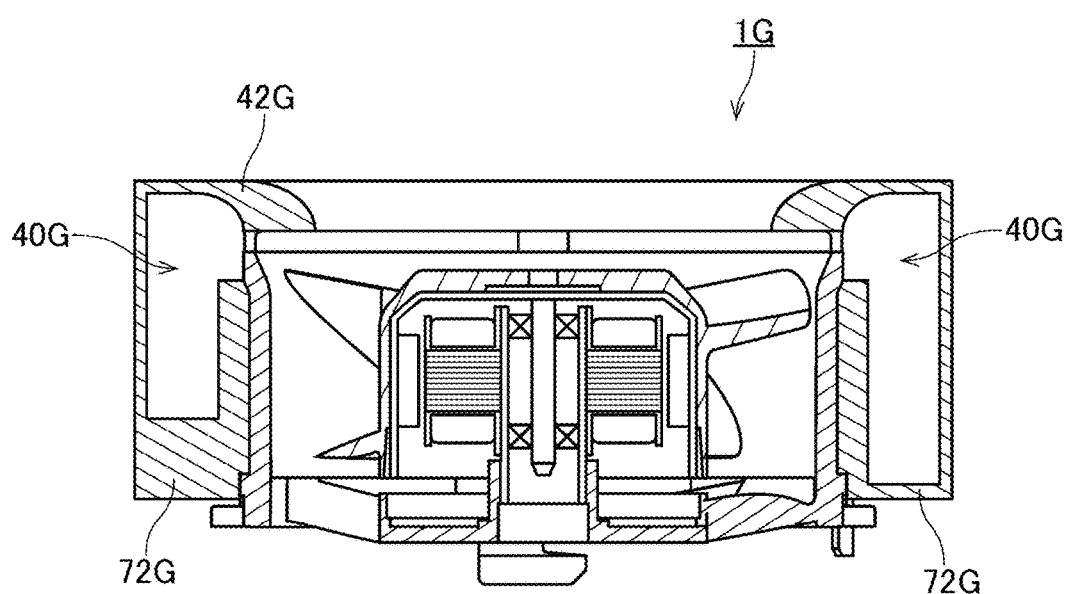
FIG. 17 is a sectional view of a fan motor according to a seventh preferred embodiment of the present invention.

FIG. 17 is a vertical sectional view of a fan motor 1G according to a seventh preferred embodiment of the present invention. In the fan motor 1G, the axial thickness of a bottom portion 72G of a silencer portion 42G varies for each of silencing spaces 40G. The sizes of the silencing spaces 40G can thus be adjusted. Thus, the frequency region for which a silencing effect is to be achieved can be adjusted by adjusting the axial thickness of the bottom portion 72G.

Figure 18:
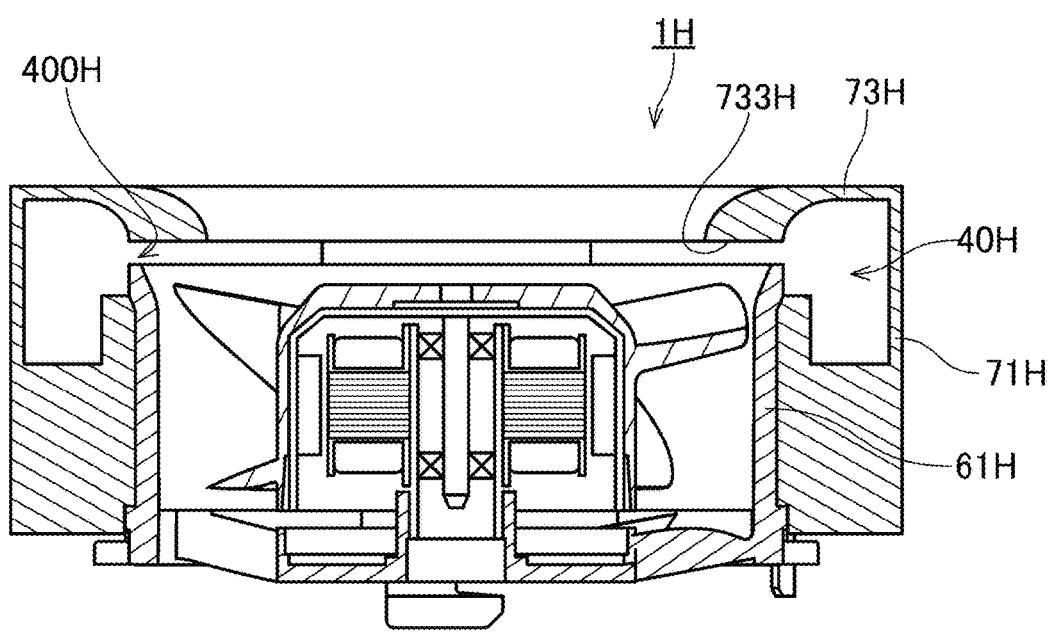
FIG. 18 is a sectional view of a fan motor according to an eighth preferred embodiment of the present invention.
Figure 19:
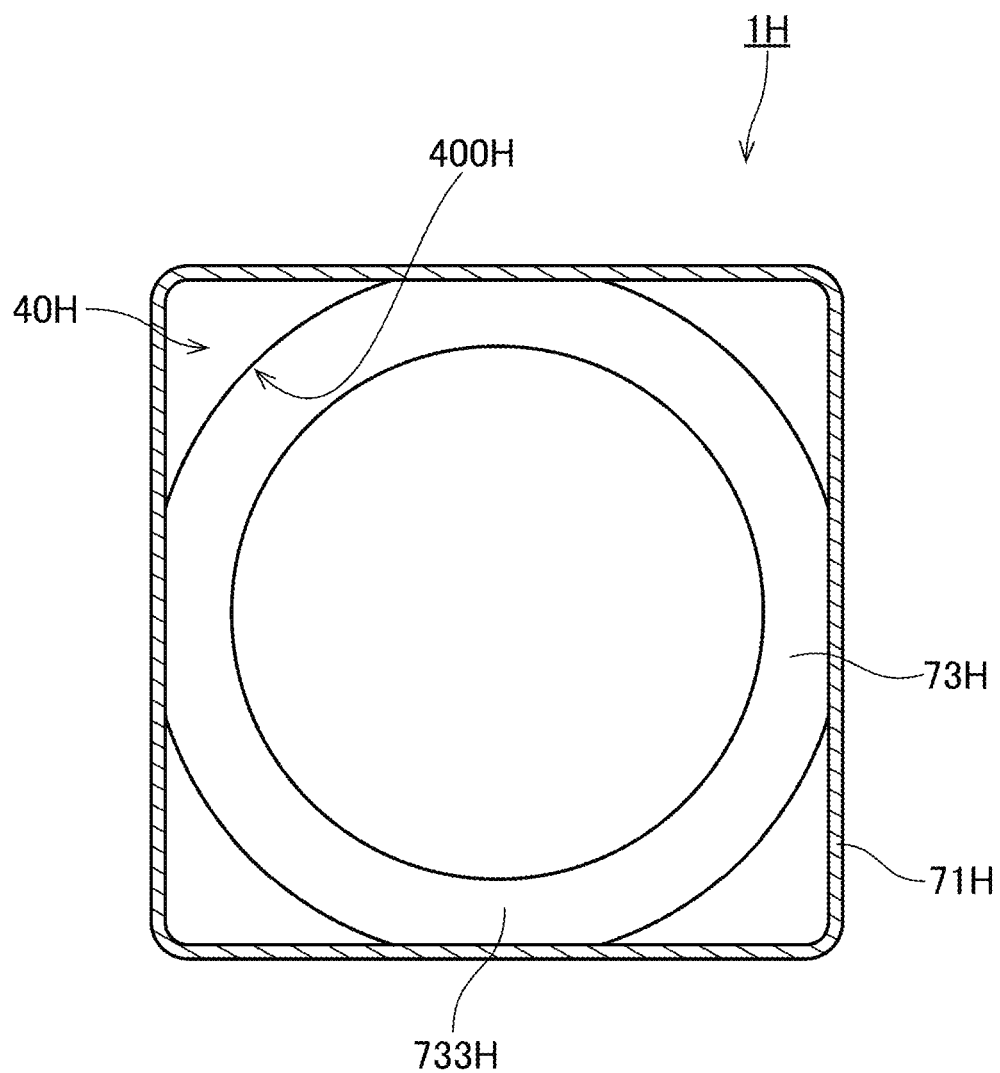
FIG. 19 is a horizontal sectional view of the fan motor according to the eighth preferred embodiment of the present invention.

FIG. 18 is a vertical sectional view of a fan motor 1H according to an eighth preferred embodiment of the present invention. FIG. 19 is a horizontal sectional view of the fan motor 1H according to the preferred embodiment illustrated in FIG. 18. The fan motor 1H does not include the arc wall portions. That is, a communicating opening 400H is defined by an upper end surface of an inner wall portion 61H, a bottom surface 733H of a flange portion 73H, and an inner surface of an outer wall portion 71H. Therefore, the circumferential extent of the communicating opening 400H is equal to the circumferential extent of a radially inner end of a silencing space 40H. The circumferential dimension of the communicating opening 400H may be varied as in the preferred embodiment illustrated in FIGS. 18 and 19.

Figure 20:
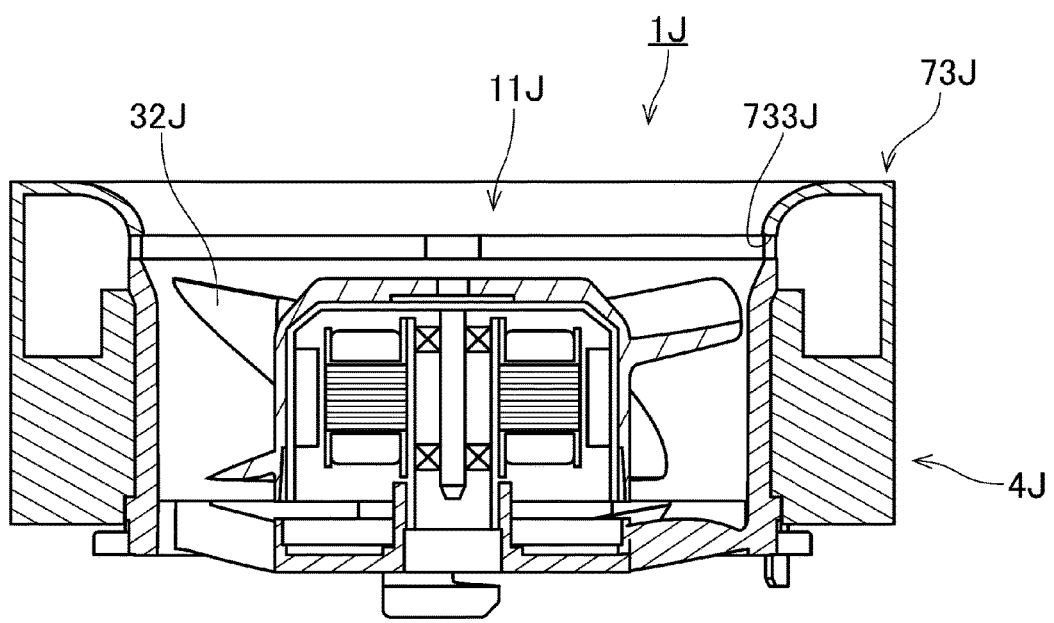
FIG. 20 is a sectional view of a fan motor according to a ninth preferred embodiment of the present invention.

FIG. 20 is a vertical sectional view of a fan motor 1J according to a ninth preferred embodiment of the present invention. In the fan motor 1J, a flange portion 73J is arranged to have a substantially uniform thickness. In addition, a bottom surface 733J of the flange portion 73J is arranged to have an outside diameter equal to the outside diameter of the bottom surface 733 of the fan motor 1 according to the above-described preferred embodiment. Further, the flange portion 73J is arranged to have an inside diameter greater than the outside diameter of blades 32J. Thus, the volume of air drawn into a housing 4J through an air inlet 11J is increased.

Figure 21:
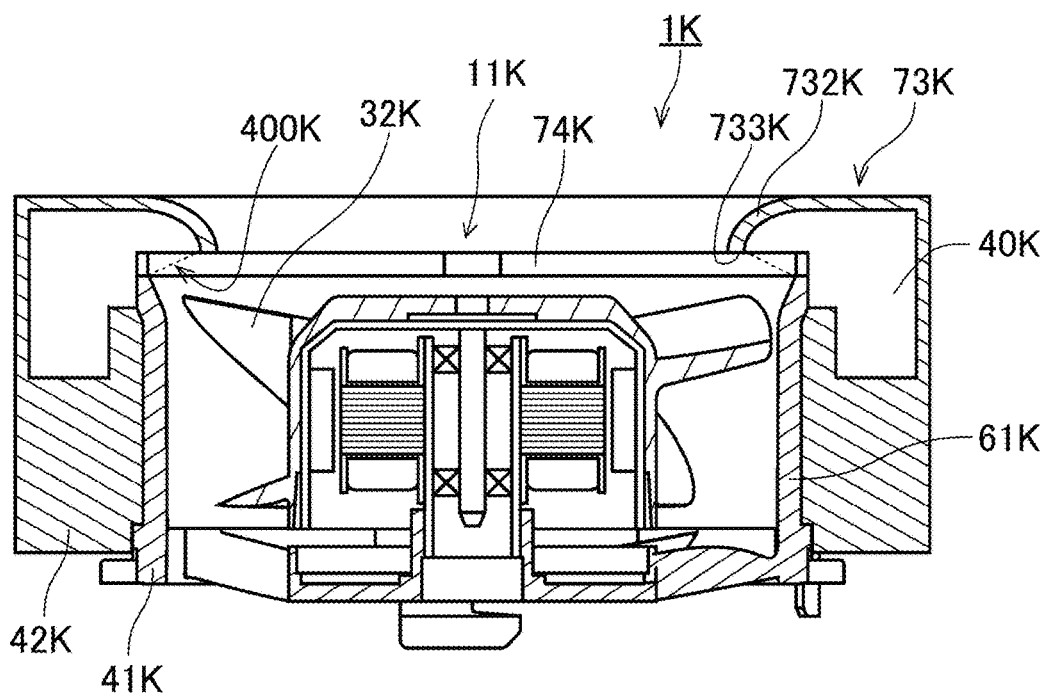
FIG. 21 is a sectional view of a fan motor according to a tenth preferred embodiment of the present invention.

FIG. 21 is a vertical sectional view of a fan motor 1K according to a tenth preferred embodiment of the present invention. In the fan motor 1K, a flange portion 73K is arranged to have a substantially uniform thickness. In addition, the flange portion 73K is arranged to have an inside diameter equal to the inside diameter of the flange portion 73 of the fan motor 1 according to the above-described preferred embodiment. In the fan motor 1K, arc wall portions 74K are included not in a silencer portion 42K but in a housing body 41K. Each arc wall portion 74K is arranged to extend upward from an upper end of an inner wall portion 61K. In addition, an upper end portion of the arc wall portion 74K is arranged at a level substantially the same as the level of a bottom surface 733K of a slanting portion 732K.

In the fan motor 1K as described above, a communicating opening 400K is arranged at an angle to the axial direction as represented by a broken line in FIG. 21. As a result, noise that occurs on the inlet side of each of blades 32K and travels upward and radially outward in a curve is easily directed to the communicating opening 400K. In addition, the communicating opening 400K of the fan motor 1K has an opening area greater than that of each communicating opening 400 of the fan motor 1 according to the above-described preferred embodiment. As a result, noise that occurs on the inlet side of each blade 32K and travels toward an air inlet 11K is more easily guided to a silencing space 40K.

Note that, although the housing body and the silencer portion are defined by separate members in the above-described preferred embodiment, this is not essential to the present invention. The housing body and the silencer portion may alternatively be defined integrally with each other.

Also note that details of the shape of a fan motor according to a preferred embodiment of the present invention may differ from details of the shape of each fan motor as illustrated in the accompanying drawings of the present application. Also note that features of the above-described preferred embodiments may be combined appropriately as long as no conflict arises.

Preferred embodiments of the present invention are applicable to fan motors.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A fan motor comprising:
    a motor including a stationary portion and a rotating portion that rotates about a rotation axis;
    an impeller including a plurality of blades, and rotating together with the rotating portion; and
    a housing that houses the motor and the impeller therein; wherein
    the housing includes:
        a tubular inner wall portion that extends from an inlet side at an upper end of the fan motor along the rotation axis to an outlet side at a lower end of the fan motor along the rotation axis, and houses at least a portion of the impeller therein;
        a silencer portion including a portion radially outside of the inner wall portion, and defining a silencing space between the inner wall portion and the silencer portion; and
        a communicating opening that brings a space inside of the inner wall portion into communication with the silencing space;
    a portion of the communicating opening is defined by an end portion of the inner wall portion on the inlet side;
    the communicating opening is positioned above an uppermost end of the impeller toward the upper end of the fan motor along the rotation axis; and
    the silencing space covers only a portion of a circumferential extent of the inner wall portion.

2. The fan motor according to claim 1, wherein the silencing space is in communication with a space outside of the silencing space only through the communicating opening.

3. The fan motor according to claim 1, wherein the silencer portion includes:
    an outer wall portion radially outside of the inner wall portion; and
    a flange portion that extends radially inward from an inlet-side end portion of the outer wall portion; and
    at least a portion of the communicating opening is defined by the end portion of the inner wall portion on the inlet side and an end portion of the flange portion on the outlet side.

4. The fan motor according to claim 3, wherein the flange portion includes, in a radially inner end portion thereof, a slanting portion that slants from the inlet side to the outlet side as the slanting portion extends radially inward.

5. The fan motor according to claim 3, wherein the flange portion is on the inlet side of the blades.

6. The fan motor according to claim 5, wherein the flange portion has an inside diameter equal to or smaller than an outside diameter of the blades.

7. The fan motor according to claim 1, wherein an end portion of each blade on the inlet side is on the outlet side of an end portion of the inner wall portion on the inlet side.

8. The fan motor according to claim 7, wherein an inner circumferential surface of the inner wall portion includes, in an end portion thereof on the inlet side, an increased diameter portion that increases in a diameter from the outlet side toward the inlet side.

9. The fan motor according to claim 1, wherein a plurality of the silencing spaces are arranged in a circumferential direction.

10. The fan motor according to claim 1, wherein
the housing includes an outer circumferential surface being substantially in a shape of a regular square when viewed in an axial direction; and
the silencing space overlaps with a corner portion of the outer circumferential surface when viewed in a radial direction.

11. The fan motor according to claim 1, further comprising a sound-absorbing sponge provided in the silencing space.

12. The fan motor according to claim 1, wherein the housing further includes a partitioning portion that partitions the silencing space in a circumferential direction.

* * * * *